(12) United States Patent
Rebhan

(10) Patent No.: US 9,443,820 B2
(45) Date of Patent: Sep. 13, 2016

(54) DEVICE AND METHOD FOR BONDING SUBSTRATES

(75) Inventor: Bernhard Rebhan, Haag am Hausruck (AT)

(73) Assignee: EV GROUP E. THALLNER GMBH, St. Florian am Inn (AT)

(*) Notice: Subject to any disclaimer, the term of this patent is extended or adjusted under 35 U.S.C. 154(b) by 0 days.

(21) Appl. No.: 14/387,380

(22) PCT Filed: May 30, 2012

(86) PCT No.: PCT/EP2012/060171
§ 371 (c)(1),
(2), (4) Date: Sep. 23, 2014

(87) PCT Pub. No.: WO2013/178260
PCT Pub. Date: Dec. 5, 2013

(65) Prior Publication Data
US 2015/0069115 A1  Mar. 12, 2015

(51) Int. Cl.
*B23K 37/00* (2006.01)
*B23K 37/04* (2006.01)
*H01L 23/00* (2006.01)
(Continued)

(52) U.S. Cl.
CPC .............. *H01L 24/75* (2013.01); *B23K 20/14* (2013.01); *B23K 20/24* (2013.01); *B23K 20/26* (2013.01); *B23K 31/02* (2013.01); *B23K 37/00* (2013.01); *H01L 21/67092* (2013.01); *H01L 2224/751* (2013.01); *H01L 2224/757* (2013.01); *H01L 2224/758* (2013.01); *H01L 2224/7525* (2013.01); *H01L 2224/81065* (2013.01);
(Continued)

(58) Field of Classification Search
CPC .................. H01L 21/67092; H01L 21/67207; H01L 2224/2781; H01L 2224/83013; B23K 1/0016; B23K 1/008; B23K 1/20; B23K 1/203; B23K 1/206; B23K 2201/40; B23K 3/047; B23K 3/08
See application file for complete search history.

(56) References Cited

U.S. PATENT DOCUMENTS 6,230,719 B1 * 5/2001 Wensel .................. B08B 3/041
                                                              118/719
7,682,979 B2  3/2010 Fu et al. ...................... 438/710
(Continued)

FOREIGN PATENT DOCUMENTS

CN       1320624 C    11/2004  ............. H01L 21/00
JP    2007-105786 A    4/2007  ............. B23K 20/24
(Continued)

OTHER PUBLICATIONS

International Search Report from corresponding International Patent Application No. PCT/EP2012/060171 (English-language translation provided).
(Continued)

*Primary Examiner* — Erin Saad
(74) *Attorney, Agent, or Firm* — Kusner & Jaffe

(57) ABSTRACT

A device for bonding of one bond side of a first substrate to one bond side of a second substrate, the device having one module group with a common working space which can be closed especially gastight to the environment, at least one bond module is connected in a sealed manner to the working space, and a movement apparatus for moving the first and second substrate in the working space.
The module group has a reduction module which is connected, in a sealed manner to the working space for reducing the bond sides.

7 Claims, 2 Drawing Sheets

(51) Int. Cl.
*H01L 21/67* (2006.01)
*B23K 20/14* (2006.01)
*B23K 20/24* (2006.01)
*B23K 20/26* (2006.01)
*B23K 31/02* (2006.01)

(52) U.S. Cl.
CPC  *H01L 2224/83065* (2013.01); *H01L 2224/94* (2013.01); *H01L 2924/1461* (2013.01)

(56) References Cited

U.S. PATENT DOCUMENTS

| 8,008,184 | B2 | 8/2011 | Matsumoto et al. | 438/618 |
| 2004/0117059 | A1 | 6/2004 | IIjima et al. | 700/213 |
| 2006/0118598 | A1* | 6/2006 | Chikamori et al. | 228/42 |
| 2007/0170227 | A1 | 7/2007 | Ohno et al. | 228/101 |
| 2008/0232948 | A1 | 9/2008 | van der Meulen et al. | 414/805 |
| 2009/0130855 | A1 | 5/2009 | Fu et al. | 438/710 |
| 2010/0112806 | A1 | 5/2010 | Matsumoto et al. | 438/643 |
| 2011/0045653 | A1 | 2/2011 | Ohno et al. | 438/455 |
| 2012/0111925 | A1 | 5/2012 | Diep et al. | 228/178 |

FOREIGN PATENT DOCUMENTS

| JP | 2004-006707 A | 1/2008 | H01L 21/00 |
| JP | 2008-300567 A | 12/2008 | H01L 21/02 |
| JP | 2009-543351 A | 12/2009 | H01L 21/3065 |

OTHER PUBLICATIONS

Office Action issued in corresponding Chinese Patent Application No. 201280072406.X dated May 19, 2016.

Search Report from corresponding Chinese Patent Application No. 201280072406.X dated May 11, 2016 (partial English-translation provided).

Office Action issued in corresponding Japanese Patent Application No. 2015-514355 dated Jun. 20, 2016.

* cited by examiner

DEVICE AND METHOD FOR BONDING SUBSTRATES

FIELD OF THE INVENTION

This invention relates to a device for bonding of one bond side of a first substrate to one bond side of a second substrate and to a corresponding method.

BACKGROUND OF THE INVENTION

In particular when bonding metallic or metalized substrates or substrates with metallic surfaces, the oxidation of the bond sides of the substrates, which are to be bonded, plays an important part, in that such oxidation makes the bond process more difficult. The oxide prevents or reduces the formation of a mechanically and/or electrically high-quality contact. Moreover, as a result of long heat-up and cooling times, this reduced contact quality is associated with a deterioration of throughput. Still further, the higher the temperature during bonding is or must be, the greater the effects of the expansion due to temperature differences on the alignment or the calibration accuracy of the substrates. Furthermore, certain MEMS devices and/or HL devices do not allow high process temperatures.

Therefore, the object of this invention is to devise a device and a method for bonding wherein the bond process can be carried out more efficiently and with less effect on the alignment accuracy.

SUMMARY OF THE INVENTION

The invention is based on the idea of ensuring an effective and/or accelerating bond by reduction of oxide layers arising on the bond sides of the first substrate and of the second substrate as uniformly and completely as possible up to making contact and bonding of the substrates. This is achieved by a module group being provided with a common working space which can be sealed relative to the atmosphere, and in which both a reduction of the bond sides and also the bonding of the substrates take place. Depending on the chemical and/or physical properties of the oxide, which is present or forming on the bond sides, a corresponding composition of the medium in the working space can be set by the separation relative to the atmosphere.

Substrates, as claimed in the invention, are Si substrates in which Cu—Cu bonds are present on the bond sides which are bonded as the process progresses. Alternatively, substrates with other metal layers, such as for example of Au, W, Ni, Pd, Pt, Sn etc. or a combination of metals, can be used. Examples of this would be Si wafers which are coated with Al, Si wafers which are coated with Cu and Sn, Si wafers which are coated with Ti, or Si substrates which are coated with Cu and a blocking layer which is conventional in the industry. The blocking layer lies under the Cu and is known to one skilled in the art to be formed, for example of Ti, Ta, W, TiN, TaN, TiW, etc. The blocking layer is intended to prevent the diffusion of the Cu into the Si. These blocking layers, also referred to as diffusion barriers, are known to one skilled in the art in the field.

Accordingly, as claimed in the invention, it is decisive to provide a working space which can be sealed, preferably hermetically, from the environment, i.e., from an oxidizing atmosphere, in which space both a reduction of possible oxide layers on the bond sides, preferably on the entire substrate, as well as bonding can be carried out. Thus, repeated oxidation of the bond sides between a reduction and the bond process can be prevented. Depending on the composition of the substrates, especially the metal coating, which is present on the substrates, different components of an atmosphere can act in an oxidizing manner. But generally, oxygen and chemical compounds which contain oxygen have an oxidizing effect. Therefore, in the working space, in addition to using a reducing composition of the medium, the concentration of oxygen and water/water vapor will be greatly reduced or will preferably be roughly zero.

According to the invention, it is contemplated to connect additional modules to the working space for further process optimization, especially for pretreatment and/or after treatment and/or measurement of the physical and/or chemical properties of the substrates which are to be bonded in the working space. Important method steps can be heating, reducing, alignment, cooling, measuring the layer thickness, etc.

This can be advantageously implemented when other modules, such as the reduction module and the bond module, are located around a central module, especially encompassing the movement apparatus, and these modules can be docked on the central module. The movement apparatus is preferably a commercial industrial robot with a corresponding end effector. The modules can be positioned or positionable in a star shape or clustered around the central module.

The reduction module is preferably built such that several bond chucks can be accommodated at the same time. In the ideal case, the reduction module and the bond module are built such that the throughput of the entire system with respect to these process steps is maximized. In one especially advantageous embodiment, at least two modules are placed upstream of the bond module, of which one is the reduction module and the second is a type of storage module. The bond chucks are loaded with the loaded wafers into the reduction module and treated. Afterwards, the bond chucks can be buffered in the storage module and are available at any time for immediate bond use. In one special embodiment, the storage module can also be built as a reduction module.

According to one advantageous embodiment of the invention, a reduction space in the reduction module and/or a bond space in the bond module is separated from the working space, especially in a sealed manner, preferably by subdividing the working space. Thus, the reduction and/or bonding can be limited to the corresponding part of the working space, as a result of which a further increase of efficiency and acceleration are enabled. The separation can take place especially by transfer between the central module and the working space and/or bond space. In addition, it is contemplated to thermally insulate and/or electromagnetically shield the reduction space and/or bonding space.

According to one embodiment, it is advantageous if the reduction space, separately from the working space, can be exposed, i.e., flushed, with a reducing atmosphere, by plasma reduction and/or gas reduction. In particular, by repeating a flushing process several times, preferably in alternation with evacuation, the reducing/reduction of the oxide layer is optimized. Ideally, the oxide layer is completely removed. Preferably, the reduction takes place in the reduction space at least largely isothermally, especially at a temperature between the reduction temperature (RT) and 400° C., preferably between RT and 300° C., even more preferably between RT and 200° C., most preferably between RT and 100° C., most preferably of all at the RT.

The reduction temperature is started by a heat ramp which can be chosen depending on the respective oxide to be reduced in order to obtain optimum results. Thus, as claimed in the invention, a temperature profile and/or a pressure profile can progress, preferably controlled by the (central) control apparatus, in the reduction space.

To the extent the reduction space and/or the bond space can be heated separately from the working space to a reduction temperature (reduction space) or bond temperature (bond space) by separate heating means, the temperature control can be controlled on the respective process. This is associated with the advantage that a smaller volume need be heated up, as a result of which the process is accelerated. Advantageously, the bond chuck and/or the wafer is brought to temperature in one of the modules and loses its heat during the short transport between the modules. Preferably, the bond chuck therefore has a high heat capacity.

It is advantageous if the reduction space can be exposed separately to a temperature profile and/or pressure profile, coupled with repeated flushing of the reduction space with a reduction medium.

According to another aspect of the invention, the working space, with the reduction space separated and/or bond space separated, can be exposed to a reducing atmosphere. Thus the working space can be separately influenced, i.e., separately controlled, when the reduction space or bond space are separated.

The handling of the wafers between the reduction module and the bond module by the working space can be carried out with lower pressure than in the vicinity/atmosphere. Due to the low pressure of the medium, especially of the gas or gas mixture, in the working space at this instant, the temperature loss of the wafer is greatly reduced during transfer since convection losses hardly take place. Thus, it can be ensured that the substrates are kept at a temperature greater than 100° C.; this prevents possible residual moisture located in the working space from leading to repeated oxidation of the wafers. Advantageously, even at this low pressure, the working space is filled with an inert and/or reducing gas, especially a forming gas.

To the extent features of the device are disclosed here and/or in the following description of the figures, they should also be considered as disclosed as features of the method and vice versa.

Other advantages, features and details of the invention will become apparent from the following description of preferred exemplary embodiments and using the drawings.

DETAILED DESCRIPTION OF PREFERRED EMBODIMENT

In the figures, advantages and features of the invention are labeled with the reference numbers which identify them according to embodiments of the invention, components or features, with the same function or function with the same effect being labeled with identical reference numbers.

Figure 1:
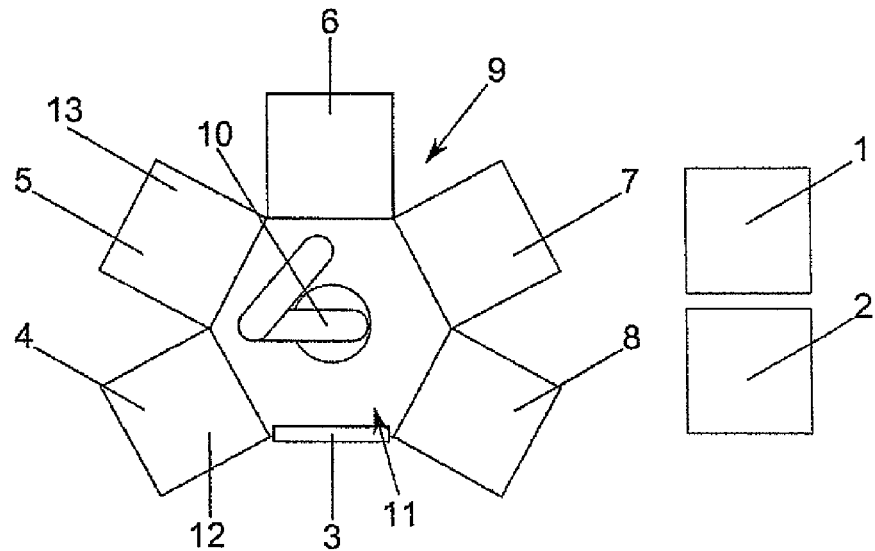
FIG. 1 shows a schematic view of a device as claimed in the invention in a first embodiment.

According to the invention, the (coarse) oxide removal according to the first embodiment (FIG. 1) is implemented such that a first substrate and a second substrate are cleaned in sequence, first in an external cleaning module 1. In this external cleaning module 1, coarse reduction or coarse removal can be undertaken by means of etching of a possible oxide. Substrates can be wafers.

The substrates are accordingly aligned to one another in an alignment module 2. The alignment takes place on a bond chuck (not shown) which accommodates and fixes the substrates which are aligned to one another. After fixing, the bond chuck and substrates can be loaded into the module group 9, and can be moved between the modules which are described below, by a movement apparatus 10 in a central module 11.

Preferably, in the immediate vicinity, there is a module group 9, which is arranged in a cluster or star-shape. The primary task of the device consists in bonding of the substrates. A working space of the module group 9 is hermetically isolated from the environment outside of the module group 9 so that no oxidizing gases can enter the working space from outside of the module group 9. This means that the atmosphere of the module group 9 can be adjusted in a controlled manner.

The cleaning module 1 and/or the alignment module 2, according to the first embodiment, are separated from the module group 9 which contains at least one bonding module 5. The bond chuck with the stack aligned and fixed on it, which stack is comprised of two substrates, is moved into the module group 9 via a lock 3. To the extent the surfaces (bond sides) to be bonded during the transport to the module group 9 are exposed to the atmosphere, repeated oxidation of the metal surfaces (bond sides) takes place. The thickness of the oxide at room temperature is dependent mainly on the atmosphere (atmospheric humidity, temperature, etc.) and the residence time of the substrates in the oxidizing atmosphere. Therefore, it is advantageous to carry out the transfer of the wafers on the bond chuck between the alignment module 2 and the module group 9 as quickly as possible.

In another embodiment, it is contemplated, in addition to the cleaning module 1 and/or the alignment module 2, to use a passivation module (not shown) which coats the surface of the wafers, which are to be later bonded with a very thin protective layer which slows down, and preferably prevents further oxidation of the surfaces. Thus, a transfer of the wafers into the module group 9 is possible with little, preferably with no oxidation of the surfaces at all.

After placing the bond chuck with the aligned wafers in the module group 9, in the case of a passivation layer which has been applied beforehand, the removal of the passivation layer takes place in a module using thermal energy and/or plasma and/or gas and/or liquid. In one special embodiment, the passivation layer removal module can also be identical to the reduction module 4.

In the case in which the aligned wafers have not been coated with a passive layer, first a thermal treatment in a reduction space 12 of a reduction module 4 in the module group 9 takes place. One embodiment of the invention comprises reducing, removing and/or diminishing the oxide which has formed by a pump-purge process, in conjunction with any method which is able to break up the oxide in a reducing atmosphere and at elevated temperature in the reduction module 4. In this process, the reduction space 12, in which the substrates are located on the bond chuck, is evacuated at programmable intervals, e.g., at programmable intervals of constant time, and is flushed with reducing gas. As a result, the atmosphere of the reduction module 4 within the module group 9 can advantageously be isolated with respect to the atmosphere of the module group 9. Each flushing process leads to a reduction of the oxide on the surface and each evacuation process to a removal of the reduction product. Repeatedly using this evacuation and flushing process makes it possible to remove the largest portion of the oxide, preferably the entire oxide, from the metal surfaces. Since this process takes place in the reduction space 12 within the reduction module 4 of the module group 9, which is hermetically blocked relative to the atmosphere and which has a reducing atmosphere, preferably a vacuum, after unloading the substrates into another module (5, 6, 7, 8) of the same module group 9, repeated oxidation can no longer take place.

Figure 2:
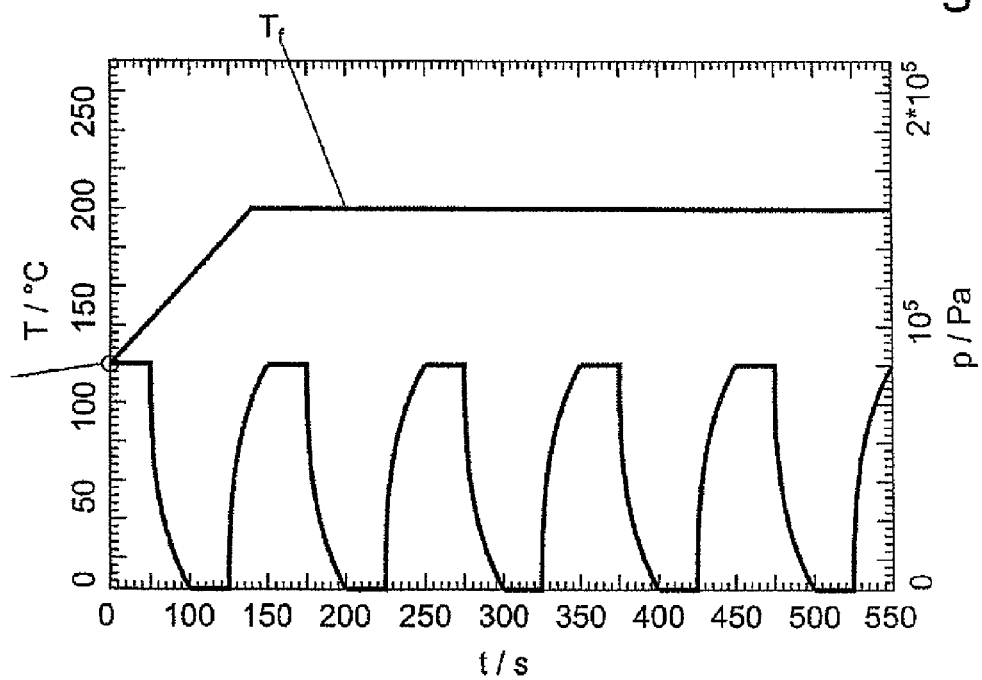
FIG. 2 shows a flow chart of a method step for reduction in a reduction space as claimed in the invention and FIG. 3 shows a schematic aspect view of a device as claimed in the invention in a second embodiment.

FIG. 2 symbolically shows a temperature characteristic and several pump-purge cycles. An initial temperature Ti is chosen such that the substrates when loading into the reduction space 12 of the reduction module 4 are not destroyed by too rapid heating. The temperature after loading of the substrates rises to the value Tf (reducing temperature). For Cu surfaces, the value for Tf is ideally roughly 195° C. The exact temperatures must be either empirically determined or computed. They can vary greatly for different oxides. The process is carried out at least largely, after a heat-up time, completely isothermally. The temperature scale is the left-hand abscissa in FIG. 2. The pressure scale for the partial pressure of the reduction gas, shown in the second graph, is the right-hand abscissa. It can be recognized that first a decrease of the pressure takes place, ideally, towards 0 Pa. This means that the reduction space 12 is evacuated. Afterwards, the reduction space 12 is flushed with reduction gas and evacuated again. This pump-purge cycle is best suited for reducing the remaining oxide of the metal surfaces and for discharging the reduction products from the reduction space 12. Since the entire working space of the module group 9 is flooded at least with an inert gas, or in the ideal case has been even cyclically evacuated, when the substrates are moving within the working space, from one module to the next, no oxidation or only a negligible amount of oxidation takes place.

After the pump-purge cycles, an isothermal heat treatment step can be carried out. The purpose of this isothermal heat treatment is to bring the wafers to the bond temperature before they are loaded into a bond space 13 of the bond module 5. In this way, the bond space 13 is not loaded with unnecessary heat-up and cooling cycles; this would adversely affect throughput. For Cu surfaces, the isotherm is at less than 200° C., preferably at less than 150° C., more preferably at less than 100° C., most preferably at less than 50° C., most preferably of all at room temperature.

The wafers to be bonded are routed within the module group 9 to the bond module 5 and are bonded to one another there. The bond process takes place at temperatures which are as low as possible, best below 200° C., preferably below 150° C., more preferably below 100° C., most preferably below 50° C., most preferably of all at room temperature. In the bond process, in the optimum case, two metal surfaces from which all oxide has been completely removed are joined to one another. The metal surfaces are preferably Cu surfaces. The diffusion process during bonding is carried out preferably under isothermal conditions. By choosing a relatively long time interval, the corresponding metal bond is produced. Since the previous oxides have been completely removed, and the temperature during bonding is kept constant, the bond process is predominantly dependent on the chosen time interval. For Cu—Cu bonds, the bond time is less than 60 minutes, preferably less than 30 minutes, more preferably less than 10 minutes, most preferably less than 5 minutes, most preferably of all less than 1 minute.

The contribution of the diffusion during the heat-up process and/or cooling process to the bond result is negligible compared to diffusion which occurs in the isothermal bond process.

Afterwards, any other process steps can take place, such as for example, cooling in a cooling module 6, with subsequent different examinations of the bond in a test module 7 (metrology tool) and optionally another test module 8 (metrology tool). After the successful bond process, the bond chuck with the bonded substrates is removed from the module group 9.

A further contemplated and useful after-treatment would be modules which allow the healing and diffusion process, stress relaxation or recrystallization processes in the bonded structures, for example, a furnace.

The atmosphere within the module group 9 is preferably a forming gas atmosphere, even more preferably an inert gas atmosphere, most preferably a vacuum, most preferably of all an ultrahigh vacuum (UHV), or a combination of the aforementioned atmospheres. A forming gas atmosphere would consist for example of the following gas mixtures:

$N_2+H_2$
$Ar+H_2$
$He+H_2$
$Ne+H_2$
$Kr+H_2$

For inert gas or forming gas atmospheres (composition of the medium), the working space is, for the most part, cleansed of oxygen and especially water or water vapor which can adhere especially to the surfaces of the internal housing of the module group 9 by prior pump-purge cleansings. The pressure in the working space is preferably less than $10^5$ Pa, preferably less than $10^3$ Pa, more preferably less than $10^1$ Pa, most preferably roughly 1 Pa.

The atmosphere in the reduction space 12 is chosen according to the chemical and/or physical properties of the oxide which is to be removed. Preferably, there is a reducing atmosphere, more preferably plasma reduction takes place, most preferably plasma and gas reductions are combined. Another possibility of oxide removal is sputtering. The sputtering process is defined as a physical sputtering process of removal.

The following gases or gas mixtures can be used as reducing atmospheres.

$H_2$
formic acid vapor
$N_2+H_2$
$Ar+H_2$
$He+H_2$
$Ne+H_2$
$Kr+H_2$
$N_2$+formic acid vapor
Ar+formic acid vapor
He+formic acid vapor
Any other reducing gases/gas mixtures . . . .

The pump-purge cycles in the reduction space 12 are repeated as often as possible, but only as long as necessary in order to minimize the process time. There are at least 3 repetitions, preferably at least 6 repetitions, even more preferably at least 9 repetitions, most ideally as many repetitions as are possible in that time interval which is dictated by the process times of the other modules, especially the bond module 5.

The reducing gas which is used in the reduction module 4 is preferably chosen such that in the reaction with the oxide on the wafer surface an increase of the surface roughness does not take place.

Figure 3:
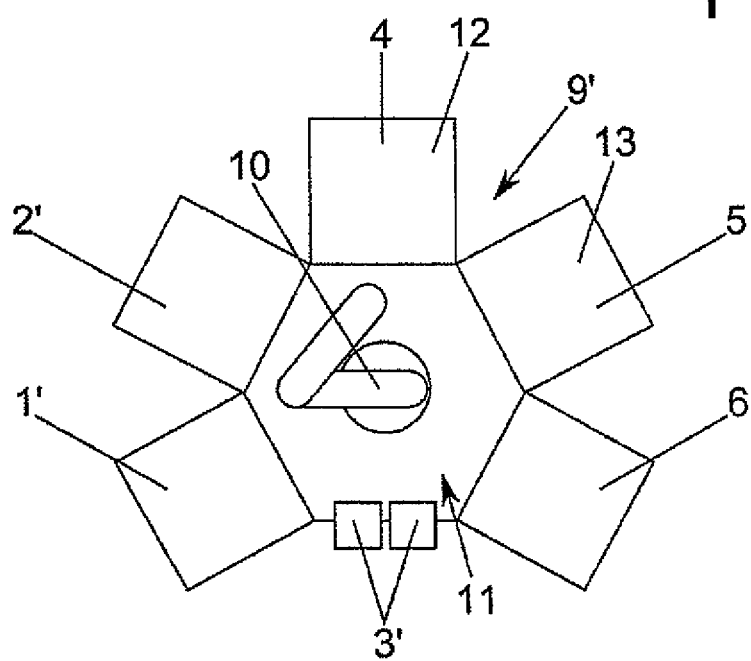

In the second exemplary embodiment of the invention, best seen in FIG. 3, the cleaning module 1' and the alignment module 2' are a component of the module group 9', therefore, connected to the central module 11. In the cleaning module 1', precleanings or coarse cleanings of the surface, or in the ideal case, even a complete or almost complete reduction of the oxide, are carried out. In the ideal case of complete or almost complete oxide reduction, a subsequent fine reduction in the module 4 is facilitated. Since in this version the alignment takes place in the alignment module 2' and the latter is already part of the module group 9, it is possible to load wafer boxes via a substrate module port 3' by so-called SMIFs (standard mechanical interface) or FOUPs (front opening unified pod or front opening universal pod). They are standardized wafer boxes with which wafers are transported. The advantage of this version is obvious. Entire wafer batches can be loaded and supplied to the working space in a completely automated manner. Alignment takes place fully automatically in the alignment module 2', which is connected to the central module 11.

General Features of the Invention

The pretreatment, cleaning, can take place either wet-chemically, by plasma, by sputtering or by mechanical forces or by reduction gases.

After the bond module, the substrate is preferably moved into a heat treatment furnace and then moved optionally into a cooling module 6.

The sequence and type of modules before and/or after the bond module are optional, in any case, preferably first coarse cleaning (cleaning module 1, 1'), then alignment (alignment module 2, 2'), then bonding (bond module 4), then heat treatment and cooling (cooling module 6) are carried out.

In special cases, the cleaning module 1 can also be a furnace. The pretreatment of cleaning is then carried out using forming gas and/or reducing gases.

REFERENCE NUMBER LIST

1, 1' cleaning module
2, 2' alignment module
3 lock
3' substrate module port
4 reduction module
5 bond module
6 cooling module
7 test module
8 test module
9 module group
10 movement apparatus
11 central module
12 reduction space
13 bond space
Ti initial temperature
Tf reduction temperature Having described the invention, the following is claimed:

1. An apparatus for bonding a bond side of a first substrate to a bond side of a second substrate, said apparatus being configured to be closed and gastight relative to a surrounding environment, comprising:
    a module group comprising:
        at least one central module comprising a movement apparatus arranged therewithin;
        at least one reduction module comprising a reduction space, the reduction space being connected in a sealed manner to the central module, the reduction module being configured to reduce the bond sides;
        at least one bond module comprising a bond space, the bond module being connected in a sealed manner to the central module, the bond module being configured to bond the substrates on the bond sides; and
        at least one process module connected in a sealed manner to the central module, the process module being configured to perform further processes with respect to the substrates to be bonded in the bond module,
    wherein the movement apparatus is configured to move the first and second substrate in the apparatus between the modules,
    wherein the reduction space in the reduction module and/or the bond space in the bond module are configured to be separated from the central module in a sealed manner,
    wherein the at least one process module comprises an alignment module configured to align the substrates to each other, and
    wherein the at least one process module further comprises a cleaning module configured to preclean, course clean, and/or completely reduce oxides from respective surfaces of the substrates.

2. The apparatus as claimed in claim 1, wherein the reduction space is exposed separately from the central module to a reducing atmosphere.

3. The apparatus as claimed in one of claim 1 or 2, wherein the reduction space and/or the bond space are respectively heated separately from the central module by a furnace to a reduction temperature for the reduction space and/or a bond temperature for the bond space.

4. The apparatus as claimed in one of claim 1 or 2, wherein the reduction space is exposed to a temperature profile and/or a pressure profile and repeatedly flushed with a reduction medium.

5. A method for bonding one bond side of a first substrate to one bond side of a second substrate in a bonding apparatus including a module group, the module group including a central module, a reduction module, a bond module, and a process module, the central module including a movement apparatus arranged therewithin, the apparatus being configured to be closed and gastight relative to a surrounding environment, the method comprising:
    processing the substrates to be bonded in the bond module, the processing being performed in the process module, said process module being connected in a sealed manner to the central module;
    moving the substrates from the process module to the reduction module using the movement apparatus;
    reducing the bond sides of said substrates in the reduction module, said reduction module being connected in a sealed manner to the central module;
    moving the from the reduction module to the bond module using the movement apparatus; and
    bonding the first substrate to the second substrate on the bond sides in the bond module, the bond module being connected in a sealed manner to the central module,
    wherein a reduction space in the reduction module and/or a bond space in the bond module are configured to be separated from the central module in a sealed manner.

6. The method as claimed in claim 5, further comprising:
    exposing the reduction space separately from the central module to a temperature profile and/or a pressure profile; and
    repeatedly flushing the reduction space with a reduction medium.

7. The method as claimed in claim 5, wherein the reduction space is exposed separately from the central module to a reducing atmosphere.

<p align="center">* * * * *</p>